United States Patent [19]

Meyer et al.

[11] Patent Number: 5,889,439
[45] Date of Patent: Mar. 30, 1999

[54] PHASE-LOCKED LOOP WITH CAPACITIVE VOLTAGE DIVIDER FOR REDUCING JITTER

[75] Inventors: Robert Meyer; Thomas Suwald, both of Hamburg, Germany

[73] Assignee: U.S. Philips Corporation, New York, N.Y.

[21] Appl. No.: 916,778

[22] Filed: Aug. 20, 1997

[30] Foreign Application Priority Data

Aug. 23, 1996 [DE] Germany .................. 196 34 084.5

[51] Int. Cl.⁶ .............................. H03L 7/08; H03L 7/099
[52] U.S. Cl. ................................... 331/17; 331/8; 331/34; 331/74; 331/108 C; 331/57; 331/177 R; 327/156
[58] Field of Search ................................. 331/1 A, 8, 15, 331/17, 18, 25, 34, 74, 108 C, 57, 177 R; 327/156–159

[56] References Cited

U.S. PATENT DOCUMENTS

| | | | |
|---|---|---|---|
| 5,036,295 | 7/1991 | Kamitani ............................. | 331/17 X |
| 5,221,911 | 6/1993 | Kasperkovitz et al. .................. | 331/17 |
| 5,402,425 | 3/1995 | Bladh ................................ | 370/105.3 |
| 5,442,325 | 8/1995 | Bosshart ............................. | 331/57 |
| 5,467,060 | 11/1995 | Miyashita ........................... | 331/74 |
| 5,483,205 | 1/1996 | Kawamura ........................... | 331/74 |
| 5,523,724 | 6/1996 | Assar et al. ......................... | 331/17 X |

OTHER PUBLICATIONS

Philips Integrated Circuits Data Sheet SAA7110; SAA7110A. One Chip Front–end 1 (OCF1) Oct. 18, 1995.
Philips Integrated Circuits Data Sheet SAA7111; Video Input Processor (VIP) Oct. 30, 1996.
Philips Integrated Circuits Data Sheet SAA7196; Digital Video Decoder, Scaler and Clock Generator Circuit (DESCPro) Nov. 4, 1996.

*Primary Examiner*—David Mis
*Attorney, Agent, or Firm*—Brian J. Wieghaus

[57] ABSTRACT

In a phase-locked loop comprising a phase detector (1), a loop filter (5) and a controlled oscillator (17) which are arranged on a common integrated circuit, interferences coupled into the substrate of the integrated circuit by other parts of the circuit are suppressed. In a first embodiment of the invention, this object is achieved in that the controlled oscillator (17) is preceded by a capacitive voltage divider (9) which comprises at least two capacitances (10, 12), the controlled oscillator (17) is controlled in dependence upon the output signal of the capacitive voltage divider (9), and the capacitive voltage divider (9), together with the phase detector (1), the loop filter (5) and the controlled oscillator (17) is arranged on an integrated circuit. In accordance with a second embodiment of the invention, the reduction of interference is achieved in that the controlled oscillator (17) has a differential structure and comprises at least two voltage-controlled current sources (18, 19) whose circuits are coupled to a power supply potential and to a substrate on which the integrated circuit is arranged, the controlled oscillator (17) has an output stage (20) which is arranged behind the voltage-controlled current sources (18, 19) and generates two differential digital signals in dependence upon the differential signals applied thereto, which differential digital signals are generated with a high edge steepness by means of switching between two potentials and are applied to amplifier stages (56, 57) which are arranged between power supply potential and reference potential and supply two differential output signals operating at reference potential.

11 Claims, 1 Drawing Sheet

PHASE-LOCKED LOOP WITH CAPACITIVE VOLTAGE DIVIDER FOR REDUCING JITTER

BACKGROUND OF THE INVENTION

The invention relates to a phase-locked loop comprising a phase detector, a loop filter and a controlled oscillator which are realized on an integrated circuit.

Such a fully integrated phase-locked loop is known from, for example the Philips ICs SAA 7196, SAA 7110 and SAA 7111. In phase-locked loops (PLL) of this type, the problem occurs that interference voltages within the integrated circuit are coupled into the elements of the phase-locked loop, ie the phase detector, the loop filter and/or the controlled oscillator, as well as further possible PLL circuit elements. An integrated circuit is built on a substrate which is provided with further layers in which the circuits are realized. The circuits themselves are not directly connected to the substrate but signals from the circuits built on the substrate are applied to the substrate by means of capacitive couplings. This is also effected in a reverse manner, ie these interferences from the substrate are coupled into other circuit elements again. This problem may be aggravated in that analog as well as digital circuits are built on such an integrated circuit. Digital circuits generally operate with signals having relatively steep edges which are capacitively coupled into the substrate in a particularly intensive way. These signals are then also coupled via capacitive couplings into analog circuits built on the substrate. Interferences then clearly become manifest in the analog circuits and in the signals conveyed by these circuits. For a phase-locked loop of the type described above, this means that the output signal is superimposed by phase fluctuations, generally referred to as jitter. This is generally undesirable.

SUMMARY OF THE INVENTION

It is an object of the invention to render a PLL built on an integrated circuit more insensitive to interferences of the kind described above.

In a first embodiment of the invention, this object is solved in that the controlled oscillator is preceded by a capacitive voltage divider which comprises at least two capacitances, in that the controlled oscillator is controlled in dependence upon the output signal of the capacitive voltage divider, and in that the capacitive voltage divider, together with the phase detector, the loop filter and the controlled oscillator is arranged on an integrated circuit.

At the output, the phase detector and the loop filter precede a capacitive voltage divider. This voltage divider divides the output voltage of a coupling point of the loop filter to a lower value, dependent on the choice of the values of the capacitances of the capacitive voltage divider. The signal which is thus divided to a lower value, ie the output signal of the capacitive voltage divider, is then applied to the controlled oscillator which supplies an output signal of varying frequency, dependent on the values of this input signal.

However, the capacitive voltage divider does not only divide the useful output signal of the loop filter to a lower value, but also interferences coupled into the phase-locked loop as far as this point. Such interferences, which are particularly coupled in by the substrate of the integrated circuit via coupling capacitances, are reduced by the division ratio of the capacitive voltage divider. The output signal of the phase detector and the loop filter is dimensioned in such a way that it has the desired value behind the capacitive voltage divider.

A reduction of the sensitivity to interference of the PLL is achieved thereby, without this causing other drawbacks. It is fundamentally also possible to increase the integration capacitance so as to reduce the sensitivity to interference. However, this would have the drawback that the dynamic behavior of the PLL would be changed in an unwanted manner and, moreover, the capacitance of the loop filter would require a larger area on the substrate. The solution in accordance with the invention obviates these drawbacks and the sensitivity to interference of the PLL is reduced, particularly without changing the dynamic behavior of the PLL. The output signal of the PLL then has a reduced jitter.

In a variant of the first embodiment of the invention, at least a first capacitance of the capacitive voltage divider is arranged in the signal path between the phase detector and the loop filter and the controlled oscillator and at least a second capacitance of the capacitive voltage divider is arranged between this signal path and a power supply potential. The values of the two capacitances define the voltage division ratio of the capacitive voltage divider.

In further variants of the first embodiment of the invention, the controlled oscillator comprises a voltage/current transformer, in dependence upon whose output current the frequency of the output signal of the controlled oscillator is varied, and at least a first capacitance of the capacitive voltage divider is arranged in the signal path between the phase detector and the loop filter and the voltage/current transformer and at least a second capacitance of the capacitive voltage divider is arranged between this signal path and a power supply potential.

If the controlled oscillator is constructed in such a way that it comprises a voltage/current transformer at the input, in dependence on whose (current) output signal an oscillator is controlled, then the output signal of the capacitive voltage divider, which represents a voltage, is applied to the input of the voltage/current transformer which transforms this signal into a current signal by means of which the actual oscillator is then controlled.

In a further variant of the first embodiment of the invention, at least a transistor arranged as a diode is provided, by means of which the DC potential at the output of the capacitive voltage divider is adjusted. The DC component at the output of the phase detector or the loop filter is lost in the capacitive voltage divider. This DC component is restored by the diode. Advantageously, two oppositely connected diodes are provided so that a reaction to deviations of the DC voltages of both polarities at the output and the input of the capacitive voltage divider can be given by these diodes. The diodes thereby improve the switch-on and switch-off behavior of the PLL because very large DC offsets are produced in this case. As compared with the prior-art solutions which do not comprise a capacitive voltage divider, there is even an improvement because the switch-on time constant of the PLL is reduced in the ratio of the capacitive voltage divider. Moreover, leakage currents which occur in integrated circuits at the output of the capacitive voltage divider are compensated by the diodes.

The object described above is solved by means of a second embodiment of the invention in that the controlled oscillator has a differential structure and comprises at least two voltage-controlled current sources whose circuits are coupled to a power supply potential and to a substrate on which the integrated circuit is arranged, while the controlled oscillator has an output stage which is arranged behind the voltage-controlled current sources and generates two differential digital signals in dependence upon the differential signals applied thereto, which differential digital signals are generated with a high edge steepness by means of switching between two potentials and are applied to amplifier stages which are arranged between power supply potential and reference potential and supply two differential output signals operating at reference potential. The controlled oscillator has a differential structure. This means that the useful signal applied to this oscillator is present in the form of two signals of opposite polarity. Interferences coupled into these two signals are, however, coupled in with the same polarity. When subtracting the two differential signals, the interferences cancel each other out but the useful signals are superimposed on each other with the same polarity.

This differential oscillator has at least two controlled current sources whose circuits are coupled to a power supply potential and to the substrate of the integrated circuit on which the PLL is provided. Conventionally, the controlled oscillator would be coupled to the power supply potential and the reference potential which is also provided as such for the other parts of the PLL. This reference potential is not identical to the potential of the substrate of the integrated circuit. Due to the reference to the potential of the substrate, the overall circuit operates relative to its potential and thus also relative to the interferences coupled into the potential by other circuit elements. Consequently, these interferences do not occur in the signals of the oscillator because the signals are referred to the potential of the substrate. The interferences on the substrate thus do not affect these oscillator circuit elements which are coupled to the substrate.

However, since the remaining part of the PLL operates with circuit elements which operate at reference potential, the controlled oscillator should supply output signals from its output which also relate to the reference potential. To this end, the controlled oscillator has an output stage which transforms the differential signals referred to the substrate into differential output signals referred to the reference potential. Then the fundamental problem occurs that, at this transformation, also the interferences coupled into the substrate become active again. This is obviated in that electronic switches are provided in the output stage, which switches are switched in dependence upon the input signals, ie the output signals of one of the voltage-controlled current sources, and are thus switched over between two voltage states. Due to this switch-over, the interferences which are still superimposed on the analog input signal are no longer present in the output signals at reference potential. The output signal is at reference potential and quasi-represents a digital signal which, however, comprises the essential information just as before, namely the resonance frequency of the controlled oscillator, but in which the interferences coupled in from the substrate are suppressed. This is achieved in that the analog oscillator operates without interference due to reference to the substrate potential and that subsequently occurring interferences are suppressed by the output stage during the transformation into signals at reference potential.

In accordance with a variant of the second embodiment of the invention, the voltage-controlled oscillator may be controlled by means of a current which is applied to first power supply terminals of the voltage-controlled current sources whose second power supply terminals are coupled to the substrate of the integrated circuit. Dependent on the current applied to these power supply terminals, the frequency of the oscillator circuit is varied. In a further implementation of the second embodiment of the invention, the voltage-controlled current sources are advantageously arranged in such a way that a first and a second voltage-controlled current source are provided which each have a non-inverting input and an inverting input and a non-inverting output and an inverting output, while both output signals of the two voltage-controlled current sources are coupled together by means of at least a capacitance which may be constituted by parasitic capacitances only, the inverting output of the first voltage-controlled current source is coupled to the non-inverting input of the second voltage-controlled current source and the non-inverting output of the first voltage-controlled current source is coupled to the inverting input of the second voltage-controlled current source, the inverting output of the second voltage-controlled current source is coupled to the inverting input of the first voltage-controlled current source and the non-inverting output of the second voltage-controlled current source is coupled to the non-inverting input of the first voltage-controlled current source, while the output signals of the second voltage-controlled current source represent the differential signals which are applied to the output stage. In this case, the voltage-controlled current sources may be realized as inverters.

The insensitivity of the PLL to interference may be further enhanced by combining both embodiments of the invention. In accordance with a further embodiment of the invention, the controlled oscillator is controlled in dependence upon the output signal of the capacitive voltage divider. It is thereby achieved that the interferences coupled in by the substrate are doubly reduced.

These and other aspects of the invention are apparent from and will be with reference to the embodiments described hereinafter.

DESCRIPTION OF THE PREFERRED EMBODIMENTS

Figure 1:
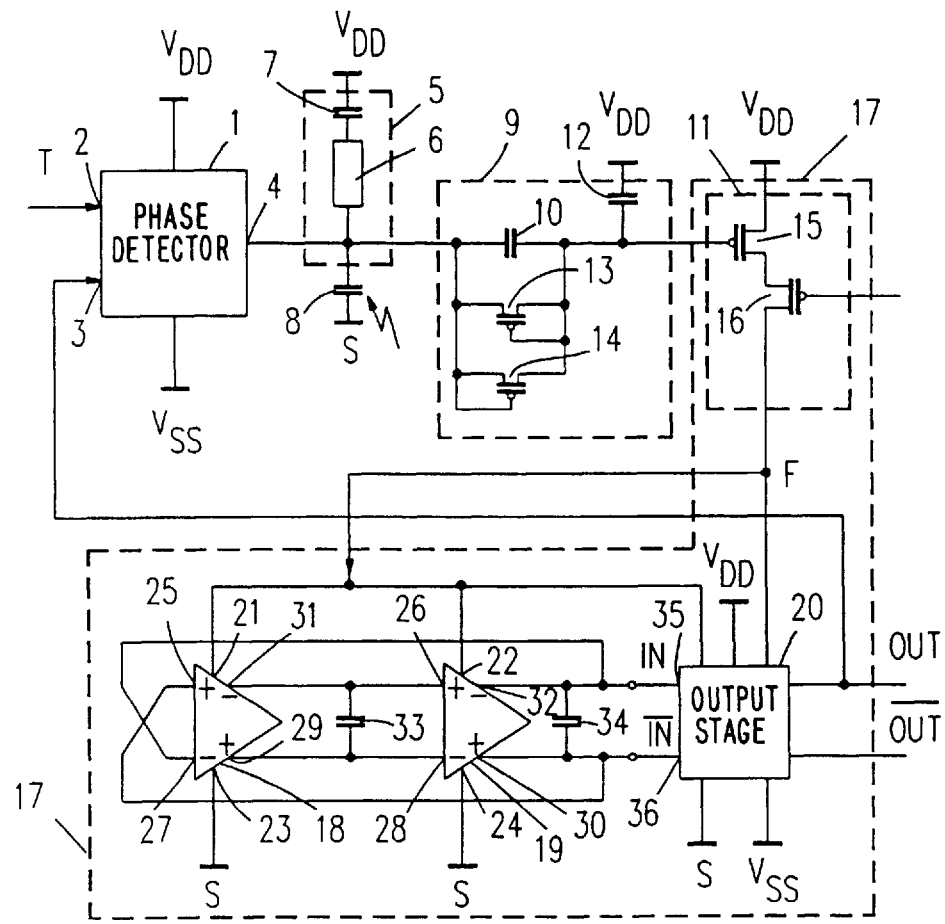
FIG. 1 is a circuit diagram of a PLL with a capacitive voltage divider in accordance with the first embodiment and a controlled oscillator in accordance with the second embodiment of the invention.

The phase-locked loop (PLL) shown in a partially diagrammatic form and partially in a detailed circuit diagram comprises a phase detector 1 shown as a circuit block. Circuit elements of the PLL not shown in the Figure operate at a power supply potential $V_{DD}$ and a reference potential $V_{SS}$. These potentials are not identical to the potential S of a substrate on which all circuit elements of the PLL of FIG. 1 are provided. An input signal T on which the PLL should lock in is applied to a first input 2 of the phase detector 1. The output signal of the circuit shown in FIG. 1, which may be divided to a lower value and is denoted by OUT, is applied to a second input 3 of the phase detector 1. Dependent on the phase difference between the input signals at the inputs 2 and 3, the phase detector 1 supplies an output signal from its output 4, which output signal is applied to a loop filter 5. The loop filter 5 comprises, for example a resistor 6 and a capacitance 7 to be realized outside the substrate. The dynamic properties of the PLL are determined by the loop filter 5.

FIG. 1 further shows a capacitance 8 which is coupled to the potential S of the substrate on which the PLL of FIG. 1 is arranged. Unwanted coupling capacitances couple potential pulses of other circuit arrangements on the same substrate into this substrate S. Via the coupling capacitance 8, which is also unavoidable, these interferences are again coupled into the PLL of FIG. 1. The output signal of the phase detector 1 and the loop filter 5 is then superimposed by these capacitively coupled interferences. This superimposition leads to unwanted frequency fluctuations in the output signal of a subsequently arranged controlled oscillator. These fluctuations are generally denoted as jitter and are undesirable.

To suppress these interferences, the output signal of the phase detector 1 and the loop filter 5 is applied to a capacitive voltage divider 9. The capacitive voltage divider comprises a first capacitance 10 whose input is coupled to the output signal of the phase detector 1 and the loop filter 5 and whose output is coupled to a voltage/current transformer 11. The series capacitance 10 precedes a second capacitance 12 coupled to the power supply potential $V_{DD}$. The values of the capacitances 10 and 12 determine the division ratio by which the voltages applied to the input of the capacitive voltage divider 9 should be divided to a lower value.

Due to the division of the input voltages to a lower value, particularly the interferences coupled in via the capacitance 8 and the substrate are reduced. It is then important that the circuit elements of the capacitive voltage divider are decoupled from the potential of the substrate. The output signal of the phase detector 1 is also reduced accordingly, but can be varied without any problem as regards its value. The value of the output signal of the phase detector 1 can thus be chosen to be such that a useful signal of the desired value is obtained at the output of the capacitive voltage divider 9. However, then the interferences coupled in via the capacitance 8 are reduced in accordance with the division ratio of the capacitive voltage divider. In this case it is not necessary to increase the value of the capacitance 7 of the loop filter, because the output signal of the phase detector 1 is divided to a lower value by the capacitive voltage divider 9 in accordance with the division ratio of the capacitive voltage divider 9. This obviates the drawback that the dynamic behavior would change due to an increase of the capacitance 7 which would otherwise be required for interference suppression.

The capacitive voltage divider 9 further comprises a first transistor 13 and a second transistor 14 which are P-doped MOS field effect transistors. Both transistors are arranged as diodes and oppositely arranged parallel to the first capacitance 10 of the capacitive voltage divider 9. At the output of the capacitive voltage divider 9, the transistors 13 and 14 arranged as diodes again adjust the direct voltage which is suppressed by the capacitance 10. On the one hand, leakage currents which particularly occur at the input 11 of the subsequent voltage/current transformer are compensated thereby. On the other hand, the starting behavior of the PLL is improved because during start-up relatively large DC components occurring in the output signal of the phase detector 1 are transferred via the diode 14 to the output of the capacitive voltage divider 9 so that the dynamic behavior of the PLL is not affected by the capacitive voltage divider. Actually, the arrangement of the diodes 13 and 14 even leads to an improved dynamic behavior as compared with circuits which do not comprise the capacitive voltage divider and the diodes 13, 14.

The output signal of the capacitive voltage divider 9 is applied to the gate input of a P-MOS field effect transistor 15 of the voltage/current transformer 11 which is arranged in a controlled oscillator 17. The source of the transistor 15 is coupled to reference potential $V_{DD}$, its drain is coupled to a further P-MOS transistor 16 which is cascode-arranged and whose output supplies a control signal F.

The controlled oscillator 17 comprises two controlled current sources 18 and 19 which represent the actual controlled oscillator. The controlled current sources 18 and 19 precede an output stage 20 which supplies the actual output signal of the controlled oscillator 17, representing the output signal of the overall PLL and being applied to the second input 3 of the phase detector 1.

The controlled oscillator 17 and particularly also the voltage-controlled current sources 18 and 19 together with their connections have a differential structure. This means that two output signals of different polarities are conveyed in the circuit. When these signals are processed, for example by means of subtraction, there is the advantage that interferences coupled into the output signals of the same sign cancel each other, but that the useful components of the output signals are superimposed on each other with the same polarity.

The output signal F of the voltage/current transformer 11 is applied to first power supply terminals 21 and 22 of the voltage-controlled current sources 18 and 19. Second power supply terminals 23 and 24 of these voltage-controlled current sources are coupled to the potential S of the substrate on which the PLL of FIG. 1 (possibly with the exception of resistor 6) is arranged. Consequently, the voltage-controlled current sources 18 and 19 operate at a potential S of the substrate so that interference potentials on the substrate S are not effective in so far as the voltage-controlled current sources 18 and 19 also operate at this potential. These interferences then do not occur in their signals relative to the potential S.

Both voltage-controlled current sources 18 and 19 have a non-inverting input 25, 26 and an inverting input 27, 28, respectively. Both voltage-controlled current sources 18 and 19 also have a non-inverting output 29, 30 and an inverting output 31, 32, respectively. A capacitance 33 is arranged between the inverting output 31 and the non-inverting output 29 of the voltage-controlled current source 18 and a capacitance 34 is arranged between the corresponding outputs 32 and 30 of the voltage-controlled current source 19, which capacitances may also consist of parasitic capacitances only.

The inverting output 31 of the voltage-controlled current source 18 is coupled to the non-inverting input 26 of the voltage-controlled current source 19. Moreover, the non-inverting output 29 of the voltage-controlled current source 18 is coupled to the inverting input 28 of the voltage-controlled current source 19.

The output signal from the inverting output 32 of the voltage-controlled current source 19 is applied to a first input 35 of the output stage 20 and fed back to the inverting input 27 of the voltage-controlled current source 18. In a corresponding manner, the output signal from the non-inverting output 30 of the voltage-controlled current source 19 represents a signal $\overline{IN}$ which is applied to a second input 36 of the output stage 20 and is fed back to the non-inverting input 35 of the voltage-controlled current source 18.

Due to this feedback mode it is achieved that the two voltage-controlled current sources 18 and 19 supply an oscillation signal whose frequency depends on the capacitances 33 and 34 and on the current which is applied to the first power supply terminals 21 and 22 of the voltage-controlled current sources 18 and 19, respectively. Both voltage-controlled current sources 18 and 19, together with their connections, represent an oscillator having a differential structure. In the circuit, the signals are conveyed with two polarities. This part of the circuit of the controlled oscillator 17 operates at the potential S of the substrate on which the PLL is arranged. Also the output signals operate at this potential S. Interferences coupled into the potential S of the substrate thus do not appear in these output signals.

The output stage 20 processes these signals in such a way that it supplies signals OUT and $\overline{\text{OUT}}$ from its output, which signals are also differential and operate at the reference potential $V_{SS}$ at which also the other signals of the PLL and its circuit elements operate. The output stage 20 essentially has the task to transform the reference of the input signals IN and $\overline{\text{IN}}$ operating at the potential of the substrate into output signals operating at the reference potential $V_{SS}$ of the other circuit elements. Interferences coupled into the substrate S should then have a possibly minimal effect on the output signals operating at the reference potential $V_{SS}$.

Figure 2:
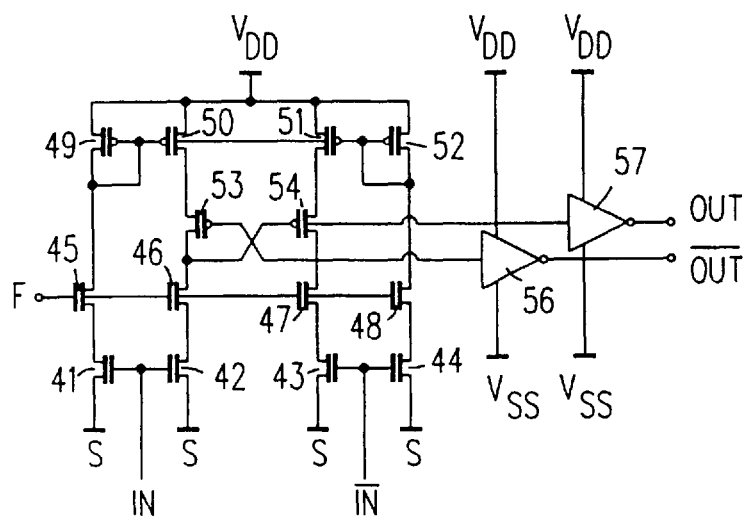
FIG. 2 is a detail of the circuit diagram of FIG. 1, showing an output stage.

The output stage 20 of the PLL of FIG. 1 is shown in a detailed circuit diagram in FIG. 2.

In FIG. 2, the signal IN is applied to the junction point between the gates of two N-MOS transistors 41 and 42 whose sources are coupled to the substrate S of the substrate potential. Two further N-MOS transistors 43 and 44 to which the signal $\overline{\text{IN}}$ is applied are arranged in a corresponding manner. The drains of the transistors 41, 42, 43 and 44 are coupled to two current mirror circuits via transistors 45, 46, 47 and 48 functioning as a cascode, whose gates are connected to the potential F of the controlled oscillator 17. The transistors 41 and 42 are coupled to a current mirror circuit constituted by two transistors 49 and 50, while the transistors 43 and 44 are coupled to a second current mirror circuit constituted by transistors 51 and 52.

Furthermore, two P-MOS field effect transistors 53 and 54 are provided, which operate as switches and can thus be turned on and off between two states of operation. The gate of transistor 53 is connected to the signal conveyed by the transistor 43. Its source and drain are arranged between the output of the current source, constituted by the transistors 49 and 50, and the transistor 42. The gate of transistor 54 is coupled to the signal conveyed by the transistor 42 and its source and drain are arranged between the transistor 43 and the output of the current source constituted by the transistors 51 and 52.

The amplifier operates as a comparator on the basis of a flipflop. The P-channel transistors 53, 54, together with the current sources 50, 51 operating as loads, are arranged as flipflops.

The transistors 42, 43 transform the input voltages IN and $\overline{\text{IN}}$ into corresponding currents with which the flipflop is fed. The transistors 42, 43 transform the input voltages IN and $\overline{\text{IN}}$ into corresponding currents which are summed and flow through the two transistors 49 and 52 parallel-arranged as diodes. The current mirror transistors 50 and 51 therefore convey a current which corresponds to the average value of the currents through the transistors 50 and 51. The flipflop is thus controlled by the difference of the input currents by which the differential input signals are transformed into two complementary signals operating at the reference potential.

Since this comparator takes a decision on the basis of the highly amplified differential signals, common-mode interferences are suppressed satisfactorily.

The transistors 45–48 operate as cascodes so that the capacitance at the output of the flipflop is decoupled from the Miller capacitances of the transistors 42 and 43. Coupling out the state of the flipflop is realized via inverters having a minimum gate surface so as not to load the velocity-defined output nodes of the flipflop too heavily.

Since there is a change-over from the substrate potential S to the reference potential $V_{SS}$ when the state of the flipflop is coupled out via the inverters 56, 57, interferences due to potential differences may also be coupled in in this case. When the edge steepness of the input signals for the inverters 56, 57 is not large enough, the inverters 56, 57 should be replaced by a flipflop circuit at reference potential $V_{SS}$. This circuit then realizes the ultimate differential-to-single conversion.

The output signals of the first part of the output stage constituted by the transistors 41 to 54, which signals are hard-switched and represent quasi-digital signals, are applied to inverters 56 and 57 operating at reference potential $V_{SS}$. The inverter 57 supplies the signal OUT from its output, representing the output signal of the overall circuit arrangement and the second input signal for the phase detector 1 of FIG. 1. The second inverter 56 supplies an inverted signal $\overline{\text{OUT}}$.

In the PLL of FIG. 1, a double suppression of interferences coupled into the potential S of the substrate with the PLL is achieved. On the one hand, the capacitive voltage divider suppresses these interferences in accordance with the division ratio of this divider. In the subsequent circuit of the controlled oscillator 17, this signal is further processed in such a way that interferences also coupled into the substrate S are largely suppressed and have a minimal effect on the useful signals of the controlled oscillator 17. The output signal OUT (as well as the inverted signal $\overline{\text{OUT}}$) is then substantially free from interferences, ie phase fluctuations, or jitter, which are undesirable in phase-locked loops. For the overall circuit, a clear reduction of interference is achieved because also the input signal OUT of the detector 1 is largely free from interference. These advantages are obtained irrespective of drawbacks relating dynamic behavior or other properties of the circuit.

We claim:

1. A circuit arrangement for transforming an analog picture signal into a digital picture signal and for decoding the digital picture signal, at least partially clocked by the output signal of a phase-locked loop, the phase-locked loop comprising;

a phase detector;

a loop filter coupled to the phase detector;

a controlled oscillator coupled by a signal path to the loop filter; and a capacitive voltage divider including a first capacitance coupled in the signal path between the loop filter and the controlled oscillator and a second capacitance coupled between the signal path and a power supply potential of the phase locked loop, the phase detector, the loop filter, the capacitive voltage divider and the controlled oscillator each being implemented on an integrated circuit having a substrate, the capacitive voltage divider dividing the voltage signal from the loop filter, including noise capacitively coupled to the phase detector and the loop filter from the substrate of the integrated circuit, and supplying the divided voltage signal to the controlled oscillator.

2. A circuit arrangement according to claim 1, wherein said controlled oscillator further comprises:

first and second serially coupled voltage controlled current sources each having a pair of differential inputs of opposite polarity and a pair of differential outputs of opposite polarity, the differential outputs of the first voltage controlled current source being coupled to a respective differential input of opposite polarity of the second voltage controlled current source, each of the differential outputs of the second voltage controlled current source being coupled to a respective differential input of the same polarity of the first voltage controlled current source, and each of the first and second voltage controlled current sources having first and second power supply terminals coupled respectively to the substrate and to the supply potential of the integrated circuit; and an output stage which output stage transforms the differential signals from the second voltage controlled current source, referenced to the potential of the substrate, to differential output signals referred to the reference potential, the differential output signal having high edge steepness.

3. A phase locked loop, comprising;

a phase detector;

a loop filter coupled to the phase detector;

a controlled oscillator coupled by a signal path to the loop filter; and a capacitive voltage divider including a first capacitance coupled in the signal path between the loop filter and the controlled oscillator and a second capacitance coupled between the signal path and a power supply potential of the phase locked loop, the phase detector, the loop filter, the capacitive voltage divider and the controlled oscillator each being implemented on an integrated circuit having a substrate, the capacitive voltage divider dividing the voltage signal from the loop filter, including noise capacitively coupled to the phase detector and the loop filter from the substrate of the integrated circuit, and supplying the divided voltage signal to the controlled oscillator.

4. A phase-locked loop as claimed in claim 3, characterized in that the controlled oscillator comprises a voltage/current transformer which outputs an output current the controlled oscillator outputting a signal having a frequency dependent on the output current of the voltage/current transformer.

5. A phase-locked loop as claimed in claim 3, further comprising a transistor arranged as a diode and coupled to the capacitive voltage divider to adjust a DC potential at the output of the capacitive voltage divider.

6. A phase-locked loop as claimed in claim 3, characterized in that the controlled oscillator is controlled in dependence upon the output signal of the capacitive voltage divider.

7. A phase locked loop according to claim 3, wherein said controlled oscillator further comprises:

first and second serially coupled voltage controlled current sources each having a pair of differential inputs of opposite polarity and a pair of differential outputs of opposite polarity, the differential outputs of the first voltage controlled current source being coupled to a respective differential input of opposite polarity of the second voltage controlled current source, each of the differential outputs of the second voltage controlled current source being coupled to a respective differential input of the same polarity of the first voltage controlled current source, and each of the first and second voltage controlled current sources having first and second power supply terminals coupled respectively to the substrate and to the supply potential of the integrated circuit, and an output stage which output stage transforms the differential signals from the second voltage controlled current source, referenced to the potential of the substrate, to differential output signals referred to the reference potential, the differential output signal having high edge steepness.

8. A phase locked loop circuit implemented on an integrated circuit having a supply potential and a substrate, the phase locked loop circuit comprising:

a phase detector;

a loop filter coupled to the phase detector and outputting a voltage signal;

a controlled oscillator coupled to the loop filter, the controlled oscillator comprising:

first and second serially coupled voltage controlled current sources each having a pair of differential inputs of opposite polarity and a pair of differential outputs of opposite polarity, the differential outputs of the first voltage controlled current source being coupled to a respective differential input of opposite polarity of the second voltage controlled current source, each of the differential outputs of the second voltage controlled current source being coupled to a respective differential input of the same polarity of the first voltage controlled current source, and each of the first and second voltage controlled current sources having first and second power supply terminals coupled respectively to the substrate and to the supply potential of the integrated circuit, and an output stage which output stage transforms the differential signals from the second voltage controlled current source, referenced to the potential of the substrate, to differential output signals referred to the reference potential, the differential output signal having high edge steepness.

9. A phase-locked loop as claimed in claim 8, characterized in that the oscillator is controlled by means of a current which is applied to first power supply terminals of the voltage-controlled current sources whose second power supply terminals are coupled to the substrate of the integrated circuit.

10. A phase-locked loop as claimed claim 8, characterized in that: the differential outputs of each of the first and second voltage-controlled current sources are coupled together by a capacitance.

11. A phase locked loop according to claim 8, wherein said output stage comprises a switching circuit coupled between the supply potential and the potential of the substrate for switching the differential signals from the second voltage controlled current source with high edge steepness, and a pair of amplifiers, each coupled between the supply potential and reference potential and amplifying a respective one of the differential signals from the switching circuit to output the differential output signals referred to the reference potential.

* * * * *